United States Patent
Ross et al.

(10) Patent No.: US 11,025,247 B1
(45) Date of Patent: Jun. 1, 2021

(54) GATE DRIVER CIRCUIT PROVIDING AN OUTPUT VOLTAGE THAT IS CLAMPED

(71) Applicant: Allegro MicroSystems, LLC, Manchester, NH (US)

(72) Inventors: Thomas Ross, Livingston (GB); Michael Munroe, Londonderry, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/065,617

(22) Filed: Oct. 8, 2020

(51) Int. Cl.
*H03L 5/00* (2006.01)
*H03K 5/08* (2006.01)
*H03K 17/16* (2006.01)
*H03K 17/687* (2006.01)
*H03K 17/74* (2006.01)
*H03K 17/082* (2006.01)

(52) U.S. Cl.
CPC ....... *H03K 17/165* (2013.01); *H03K 17/0822* (2013.01); *H03K 17/687* (2013.01); *H03K 17/74* (2013.01)

(58) Field of Classification Search
CPC .................. H03K 17/165; H03K 17/0822
USPC ........................................................ 327/321
See application file for complete search history.

(56) References Cited

U.S. PATENT DOCUMENTS

| | | | |
|---|---|---|---|
| 6,559,689 B1 | 5/2003 | Clark | |
| 7,649,325 B2 | 1/2010 | McIntosh et al. | |
| 9,214,884 B2 | 12/2015 | Sonoda et al. | |
| 9,294,084 B1 | 3/2016 | McIntosh et al. | |
| 9,935,452 B2 | 4/2018 | Looby et al. | |
| 10,084,407 B2 | 9/2018 | Looby et al. | |
| 2019/0305547 A1 | 10/2019 | Tran | |
| 2021/0057978 A1* | 2/2021 | Song | H02M 7/53871 |

OTHER PUBLICATIONS

U.S. Appl. No. 16/819,765, filed Mar. 16, 2020, Lu.
U.S. Appl. No. 16/930,592, filed Jul. 16, 2020, Haselhuhn Jr. et al.
U.S. Appl. No. 16/935,656, filed Jul. 22, 2020, Metivier et al.
U.S. Appl. No. 17/017,109, filed Sep. 10, 2020, Ross et al.
U.S. Appl. No. 17/112,172, filed Dec. 4, 2020, Ross et al.

* cited by examiner

*Primary Examiner* — Metasebia T Retebo
(74) *Attorney, Agent, or Firm* — Daly, Crowley, Mofford & Durkee, LLP

(57) ABSTRACT

In one aspect, a gate driver circuit includes a clamp circuit connecting a first node to a second node. The clamp circuit is configured to provide a clamp voltage. The gate driver circuit also includes a first driver connected to the first node and to the second node. The first driver comprising a first input configured to receive the clamp voltage from the clamp circuit. The gate driver circuit further includes a first transistor having a drain connected to the first node, a source connected to a circuit output and a gate connected to an output of the first driver. The first transistor has a gate-to-source voltage and an output voltage of the circuit output does not exceed the clamp voltage less the gate-to-source voltage of the first transistor.

36 Claims, 2 Drawing Sheets

GATE DRIVER CIRCUIT PROVIDING AN OUTPUT VOLTAGE THAT IS CLAMPED

BACKGROUND

Typically, a gate driver receives a low power input and produces a higher power output. Sometimes a gate driver is fabricated in an integrated circuit (IC) and formed in a n-type epitaxial structure that is on top of a p-type substrate. The interface between the n-type epitaxial structure and the p-type substrate forms a diode (p-n junction). Typically, this diode is not active; however, if the diode turns on, unwanted current becomes available that may destroy the gate driver and the IC.

SUMMARY

In one aspect, a gate driver circuit includes a clamp circuit connecting a first node to a second node. The clamp circuit is configured to provide a clamp voltage. The gate driver circuit also includes a first driver connected to the first node and to the second node. The first driver comprising a first input configured to receive the clamp voltage from the clamp circuit. The gate driver circuit further includes a first transistor having a drain connected to the first node, a source connected to a circuit output and a gate connected to an output of the first driver. The first transistor has a gate-to-source voltage and an output voltage of the circuit output does not exceed the clamp voltage less the gate-to-source voltage of the first transistor.

In another aspect, an integrated circuit (IC) includes a clamp circuit connecting a first node to a second node. The clamp circuit configured to provide a clamp voltage. The IC also includes a first driver connected to the first node and to the second node. The first driver includes a first input configured to receive the clamp voltage from the clamp circuit. The IC also includes a first transistor having a drain connected to the first node, a source connected to a circuit output and a gate connected to an output of the first driver; a second transistor having a drain connected to the circuit output and a source connected to the second node; a second driver connected to the first node and to the second node; and a clamp connecting the first node and the second node. The second driver has an output connected to the gate of the second transistor. The first transistor has a gate-to-source voltage and an output voltage of the circuit output does not exceed the clamp voltage less the gate-to-source voltage of the first transistor.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to limit the amount of voltage provided to an external device (e.g., a gate of an external transistor) and prevent the external device from being destroyed. The effects of negative transients (voltages) that may be caused, for example, by an inductive load may result in a significantly higher voltage provided to the external device. In particular, the negative transients may cause a bootstrap capacitor, which provides voltage to the external device, to become overcharged. The techniques described herein mitigate the effects of overcharging by the bootstrap capacitor that may destroy the external device.

Figure 1:
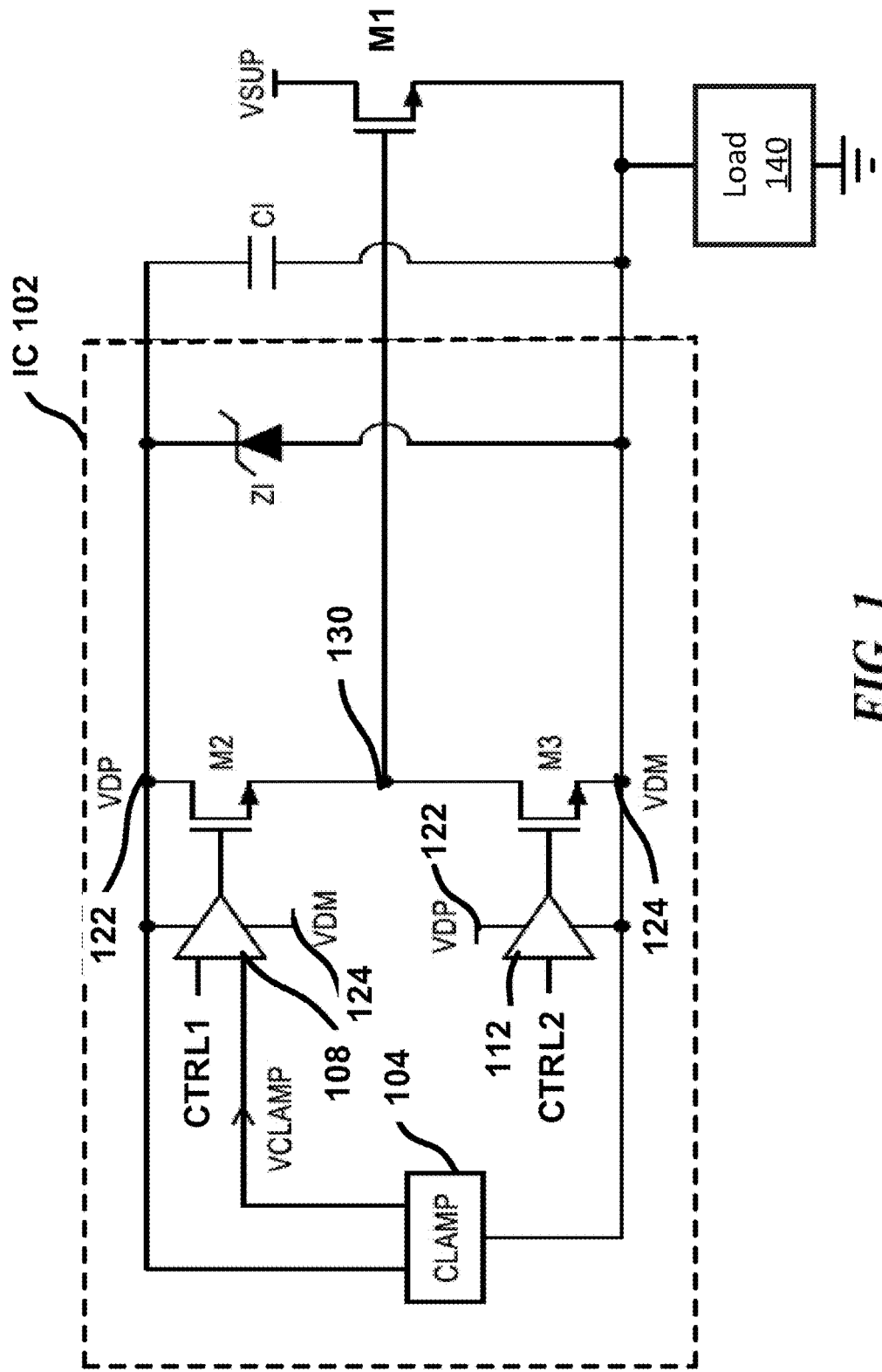
FIG. 1 is a block diagram of an example of a gate driver circuit.

Referring to FIG. 1, gate driver circuit 100 includes an IC 102, a capacitor C1, an external transistor M1 and a load 140. The capacitor has a top plate connected to a first node 122 and a bottom plate connected to a second node 124. The capacitor C1 is sometimes called a bootstrap capacitor. The first node has a voltage VDP and the second node has a voltage VDM.

The external transistor M1 has a drain that is connected to a voltage supply VSUP and a source connected to the second node 124. A gate of the external transistor M1 is connected to an output node 130 of the IC 102.

The load 140 is connected to the second node 124 and to ground. In one example, the load 140 may be a coil. In one particular example, the load 140 may be a motor coil. In a further example, the load 140 may be another power transistor, which would then form a half-bridge configuration.

The IC 102 includes a clamp circuit 104, a first driver 108, a second driver 112, a transistor M2, a transistor M3 and a Zener diode Z1 having a cathode connected to a first node 122 and an anode connected to a second node 124. The clamp circuit 104 is connected to the first node 122, to the second node 124 and to a first input of the first driver 108. In one example, the Zener diode Z1 may be a Zener-triggered Darlington electrostatic discharge (ESD) clamp. In other examples, the Zener diode Z1 may be replaced by other types of clamps or circuits that clamp.

The first driver 108 is connected to the first node 122 and to the second node 124. The first driver 108 has a second input connected to a control signal CTRL1 and an output connected to the transistor M2. In one example, the control signal CTRL1 turns on or off the first driver 108. In one example, the control signal CTRL1 is a voltage signal. In another example, the control signal CTRL1 is a current signal.

The transistor M2 has a drain connected to the first node 122, a gate connected to the output of the first driver 108 and a source connected to the output node 130 of the IC 102. The transistor M3 has a drain connected to the output node 130 of the IC 102, a gate connected to an output of the second driver 112 and a source connected to the second node 124.

The second driver 112 is connected to the first node 122 and to the second node 124. The second driver 112 has an input connected to a control signal CTRL2. In one example, the control signal CTRL2 turns on or off the first driver 112. In one example, the control signal CTRL2 is a voltage signal. In another example, the control signal CTRL2 is a current signal.

In one example, the control signal CTRL1 is low and the control signal CTRL2 is high. With the control signal CTRL2 high, the second driver 112 provides a signal that turns on the transistor M3. With the control signal CTRL1 low, the first driver 108 does not provide a signal to the transistor M2 (or not enough of a signal to turn transistor M2 on); and therefore, the transistor M2 is off. With the transistor M2 off and the transistor M3 on, the external transistor M1 receives a low signal such that the gate-to-source voltage of M1 is zero volts; and therefore, the transistor M1 is off.

In one example, to turn on the external transistor M1, the control signal CTRL1 is high and the control signal CTRL2 is low. With the control signal CTRL2 low, the second driver 112 provides no signal to the transistor M3 (or not enough of a signal to turn transistor M3 on); and therefore, the transistor M3 is off. With the control signal CTRL1 high, the first driver 108 provides a signal to the transistor M2; and therefore, the transistor M2 is on. With the transistor M2 on and the transistor M3 off, the external transistor M1 receives a signal; and therefore, the transistor M1 is on.

Without the transistor M2, for negative transient events on the second node 124, the bottom plate of the capacitor C1 would follow thereby increasing the voltage that would be provided to the transistor M1. That is, without the transistor M2, the gate of M1 would follow the voltage at the first node 122. During negative transient events, the capacitor voltage from C1 (i.e., the voltage of the first node 122 less the voltage at the second node 124) would overcharge the gate of M1. However, with the transistor M2, the voltage to the gate of the transistor M1 is limited to VCLAMP less the gate-to-source voltage of the transistor M2 (e.g., 1 Volt). Thus, while the voltage VDP at the first node 122 may increase above VCLAMP, for example; the voltage at the output node 130 does not go above VCLAMP less the gate-to-source voltage of the transistor M2.

Figure 2:
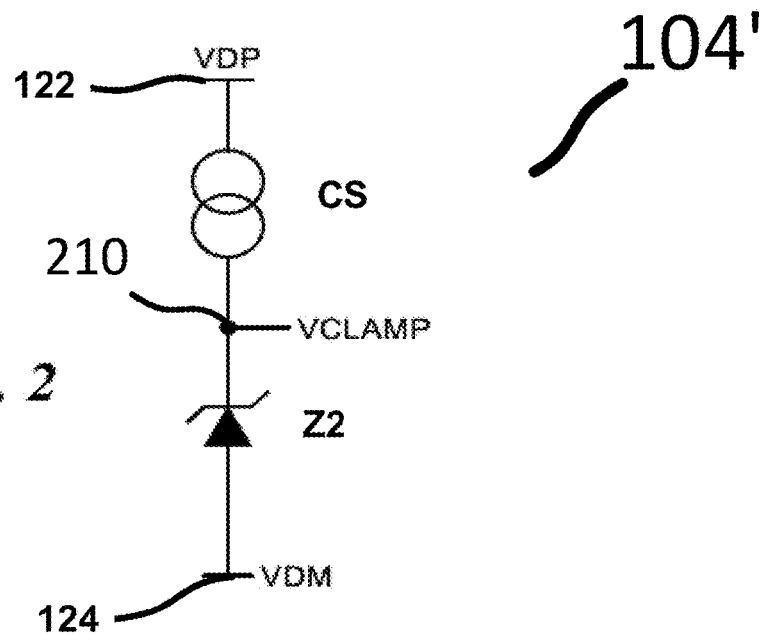
FIG. 2 is a circuit diagram of an example of a clamp circuit.

Referring to FIG. 2, an example of the clamp circuit 104 (FIG. 1) is a clamp circuit 104'. The clamp circuit 104' includes a Zener diode Z2 having an anode connected to the second node 124 and a cathode connected to a third node 210. The claim circuit 104' also includes a current source CS connected to the third node 210 and the first node 122. The third node 210 provides the clamp voltage.

Figure 3:
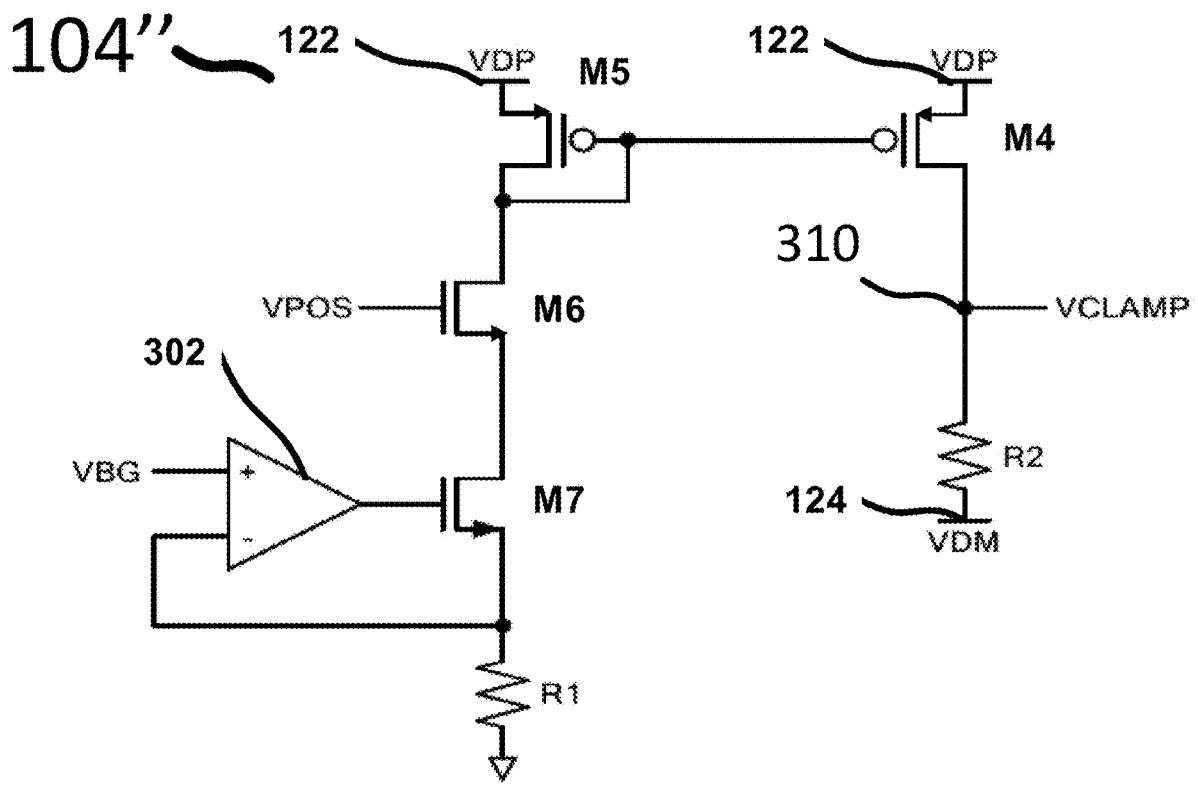
FIG. 3 is a circuit diagram of another example of the clamp circuit.

Referring to FIG. 3, another example of the clamp circuit 104 is a clamp circuit 104". The clamp circuit 104" includes a resister R2 connected to the second node 124 at one end and a fourth node 310 at a second end. The fourth node 310 provides the clamp voltage.

The clamp circuit 104" also includes a transistor M4 having a drain connected to the fourth node 310, a source connected to the second node 122 and a gate connected to a gate of a transistor M5; the transistor M5 having a source connected to a second node 122, a drain connected to a drain of a transistor M6 and a gate connected to the drain of the transistor M5; the transistor M6 having a gate connected to a voltage supply VPOS and a source connected to a drain of a transistor M7; and the transistor M7 having a source connected to a resistor R1 and a first input to an op amp 302, and a gate connected to an output of the op amp 302.

The clamp circuit 104" further includes the op amp 302 having a second input connected to a voltage supply VBG; and the resistor R1, which is connected to the ground.

In one example, the transistors M2, M3, M6, M7 are each a n-channel metal-oxide-semiconductor field-effect transistor (NMOS). In one example, the transistors M4, M5 are each a p-channel metal-oxide-semiconductor field-effect transistor (PMOS). In one particular example, the transistor M6 is a higher-voltage capable transistor (i.e., the voltage on its drain can go all the way to VDP (first node) and still survive (also commonly called a "cascode" transistor)).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A gate driver circuit comprising:
a clamp circuit connecting a first node to a second node, the clamp circuit configured to provide a clamp voltage to a first driver;
the first driver connected to the first node and to the second node, the first driver comprising a first input configured to receive the clamp voltage from the clamp circuit; and
a first transistor having a drain connected to the first node, a source connected to a circuit output and a gate connected to an output of the first driver, wherein the first transistor has a gate-to-source voltage, wherein the clamp circuit is not directly connected to the gate of the first transistor,
wherein an output voltage of the circuit output does not exceed the clamp voltage less the gate-to-source voltage of the first transistor.
2. The gate driver circuit of claim 1, further comprising a second transistor having a drain connected to the circuit output and a source connected to the second node.
3. The gate driver circuit of claim 2, further comprising a second driver connected to the first node and to the second node,
wherein the output of the second driver is connected to the gate of the second transistor.
4. The gate driver circuit of claim 2, wherein the second transistor is an NMOS.
5. The gate driver circuit of claim 1, further comprising a Zener diode connecting the first node and the second node.
6. The gate driver circuit of claim 1, wherein the first node is configured to connect to a first end of a capacitor and the second node is configured to connect to a second end of the capacitor.
7. The gate driver circuit of claim 1, wherein the first transistor is a n-channel metal-oxide-semiconductor field-effect transistor (NMOS).
8. The gate driver circuit of claim 1, wherein the second node is configured to be connected to a load.
9. The gate driver circuit of claim 8, wherein the load is a coil.
10. The gate driver circuit of claim 1, wherein the gate driver circuit is an integrated circuit.
11. A gate driver circuit comprising:
a clamp circuit connecting a first node to a second node, the clamp circuit configured to provide a clamp voltage;
a first driver connected to the first node and to the second node, the first driver comprising a first input configured to receive the clamp voltage from the clamp circuit; and
a first transistor having a drain connected to the first node, a source connected to a circuit output and a gate connected to an output of the first driver, wherein the first transistor has a gate-to-source voltage,
wherein an output voltage of the circuit output does not exceed the clamp voltage less the gate-to-source voltage of the first transistor,
wherein the circuit output is configured to be connected to a gate of an external transistor.
12. The gate driver circuit of claim 11, further comprising a second transistor having a drain connected to the circuit output and a source connected to the second node.

13. The gate driver circuit of claim 12, further comprising a second driver connected to the first node and to the second node,
wherein the output of the second driver is connected to the gate of the second transistor.

14. The gate driver circuit of claim 11, further comprising a Zener diode connecting the first node and the second node.

15. The gate driver circuit of claim 11, wherein the first node is configured to connect to a first end of a capacitor and the second node is configured to connect to a second end of the capacitor.

16. The gate driver circuit of claim 11, wherein the second node is configured to be connected to a coil.

17. A gate driver circuit comprising:
a clamp circuit connecting a first node to a second node, the clamp circuit configured to provide a clamp voltage;
a first driver connected to the first node and to the second node, the first driver comprising a first input configured to receive the clamp voltage from the clamp circuit; and
a first transistor having a drain connected to the first node, a source connected to a circuit output and a gate connected to an output of the first driver, wherein the first transistor has a gate-to-source voltage,
wherein an output voltage of the circuit output does not exceed the clamp voltage less the gate-to-source voltage of the first transistor,
wherein the clamp circuit comprises:
a current source connected to the first node; and
a Zener diode having an anode connected to the second node and a cathode connected to the current source at a third node,
wherein the third node provides the clamp voltage.

18. The gate driver circuit of claim 17, further comprising a second transistor having a drain connected to the circuit output and a source connected to the second node.

19. The gate driver circuit of claim 18, further comprising a second driver connected to the first node and to the second node,
wherein the output of the second driver is connected to the gate of the second transistor.

20. The gate driver circuit of claim 17, further comprising a Zener diode connecting the first node and the second node.

21. The gate driver circuit of claim 17, wherein the first node is configured to connect to a first end of a capacitor and the second node is configured to connect to a second end of the capacitor.

22. The gate driver circuit of claim 17, wherein the second node is configured to be connected to a coil.

23. A gate driver circuit comprising:
a clamp circuit connecting a first node to a second node, the clamp circuit configured to provide a clamp voltage;
a first driver connected to the first node and to the second node, the first driver comprising a first input configured to receive the clamp voltage from the clamp circuit; and
a first transistor having a drain connected to the first node, a source connected to a circuit output and a gate connected to an output of the first driver, wherein the first transistor has a gate-to-source voltage,
wherein an output voltage of the circuit output does not exceed the clamp voltage less the gate-to-source voltage of the first transistor, wherein the clamp circuit comprises:
a second transistor; and
a first resistor connected to a drain of the second transistor at a third node,
wherein the third node provides the clamp voltage.

24. The gate driver circuit of claim 23, wherein the clamp circuit further comprises:
a third transistor having a gate connected to the gate of the second transistor, a source connected to the first node, and a drain connected to the gate of the second transistor;
a fourth transistor having a drain connected to the drain of the third transistor and a gate connected to a first power supply;
a fifth transistor having a drain connected to a source of the fourth transistor;
a second resistor connected to ground; and
an amplifier having a first input connected to the second resistor, a second input connected to a second power supply and an output connected to a gate of the fifth transistor.

25. The gate driver circuit of claim 24, wherein the second transistor and the third transistor are each a p-channel metal-oxide-semiconductor field-effect transistor (PMOS).

26. The gate driver circuit of claim 25, wherein the fourth transistor and the fifth transistor are each a n-channel metal-oxide-semiconductor field-effect transistor (NMOS).

27. The gate driver circuit of claim 23, further comprising a second transistor having a drain connected to the circuit output and a source connected to the second node.

28. The gate driver circuit of claim 27, further comprising a second driver connected to the first node and to the second node,
wherein the output of the second driver is connected to the gate of the second transistor.

29. The gate driver circuit of claim 23, further comprising a Zener diode connecting the first node and the second node.

30. The gate driver circuit of claim 23, wherein the first node is configured to connect to a first end of a capacitor and the second node is configured to connect to a second end of the capacitor.

31. The gate driver circuit of claim 23, wherein the second node is configured to be connected to a coil.

32. An integrated circuit (IC) comprising:
a clamp circuit connected a first node to a second node, the clamp circuit configured to provide a clamp voltage to a first driver;
the first driver connected to the first node and to the second node, the first driver comprising a first input configured to receive the clamp voltage from the clamp circuit;
a first transistor having a drain connected to the first node, a source connected to a circuit output and a gate connected to an output of the first driver, wherein the first transistor has a gate-to-source voltage, wherein the clamp circuit is not directly connected to the gate of the first transistor;
a second transistor having a drain connected to the circuit output and a source connected to the second node;
a second driver connected to the first node and to the second node, the second driver having an output connected to the gate of the second transistor; and
a clamp connecting the first node and the second node,
wherein an output voltage of the circuit output does not exceed the clamp voltage less the gate-to-source voltage of the first transistor.

33. An integrated circuit (IC) comprising:
a clamp circuit connected a first node to a second node, the clamp circuit configured to provide voltage;
a first driver connected to the first node and to the second node, the first driver comprising a first input configured to receive the clamp voltage from the clamp circuit;
a first transistor having a drain connected to the first node, a source connected to a circuit output and a gate connected to an output of the first driver, wherein the first transistor has a gate-to-source voltage;
a second transistor having a drain connected to the circuit output and a source connected to the second node;
a second driver connected to the first node and to the second node, the second driver having an output connected to the gate of the second transistor; and
a clamp connecting the first node and the second node,
wherein an output voltage of the circuit output does not exceed the clamp voltage less the gate-to-source voltage of the first transistor,
wherein the clamp circuit comprises:
    a current source connected to the first node; and
    a Zener diode having an anode connected to the second node and a cathode connected to the current source at a third node,
    wherein the third node provides the clamp voltage.

34. An integrated circuit (IC) comprising:
a clamp circuit connected a first node to a second node, the clamp circuit configured to provide voltage;
a first driver connected to the first node and to the second node, the first driver comprising a first input configured to receive the clamp voltage from the clamp circuit;
a first transistor having a drain connected to the first node, a source connected to a circuit output and a gate connected to an output of the first driver, wherein the first transistor has a gate-to-source voltage;
a second transistor having a drain connected to the circuit output and a source connected to the second node;
a second driver connected to the first node and to the second node, the second driver having an output connected to the gate of the second transistor; and
a clamp connecting the first node and the second node,
wherein an output voltage of the circuit output does not exceed the clamp voltage less the gate-to-source voltage of the first transistor,
wherein the clamp circuit comprises:
    a third transistor; and
    a first resistor connected to a drain of the third transistor at a third node,
    wherein the third node provides the clamp voltage.

35. The IC of claim 34, wherein the clamp circuit further comprises:
a fourth transistor having a gate connected to a gate of the third transistor, a source connected to the first node, and a drain connected to the gate of the fourth transistor;
a fifth transistor having a drain connected to a source of the fourth transistor and a gate connected to a first power supply;
a sixth transistor having a drain connected to a source of the fifth transistor;
a second resistor connected to ground; and
an amplifier having a first input connected to the second resistor, a second input connected to a second power supply and an output connected to a gate of the sixth transistor.

36. An integrated circuit (IC) comprising:
a clamp circuit connected a first node to a second node, the clamp circuit configured to provide a clamp voltage;
a first driver connected to the first node and to the second node, the first driver comprising a first input configured to receive the clamp voltage from the clamp circuit;
a first transistor having a drain connected to the first node, a source connected to a circuit output and a gate connected to an output of the first driver, wherein the first transistor has a gate-to-source voltage;
a second transistor having a drain connected to the circuit output and a source connected to the second node;
a second driver connected to the first node and to the second node, the second driver having an output connected to the gate of the second transistor; and
a clamp connecting the first node and the second node,
wherein an output voltage of the circuit output does not exceed the clamp voltage less the gate-to-source voltage of the first transistor,
wherein the first node is configured to connect to a first end of a capacitor and the second node is configured to connect to a second end of the capacitor,
wherein the circuit output is configured to be connected to a gate of an external transistor.

* * * * *

UNITED STATES PATENT AND TRADEMARK OFFICE
CERTIFICATE OF CORRECTION

PATENT NO. : 11,025,247 B1
APPLICATION NO. : 17/065617
DATED : June 1, 2021
INVENTOR(S) : Thomas Ross et al.

It is certified that error appears in the above-identified patent and that said Letters Patent is hereby corrected as shown below:

In the Specification

Column 1, Line 34, delete "circuit configured" and replace with --circuit is configured--.

Column 3, Line 34, delete "claim" and replace with --clamp--.

Column 7, Line 3, delete "provide voltage;" and replace with --provide a clamp voltage;--.

Column 7, Line 29, delete "provide voltage;" and replace with --provide a clamp voltage;--.

Signed and Sealed this
Twenty-fourth Day of May, 2022

Katherine Kelly Vidal
*Director of the United States Patent and Trademark Office*